United States Patent
Zhang et al.

(10) Patent No.: US 12,426,189 B2
(45) Date of Patent: Sep. 23, 2025

(54) SPLICING STRUCTURE AND DISPLAY SCREEN

(71) Applicant: Shanghai Tianma Micro-electronics Co., Ltd., Shanghai (CN)

(72) Inventors: Kaikai Zhang, Shanghai (CN); Yongxin He, Shanghai (CN)

(73) Assignee: Shanghai Tianma Micro-electronics Co., Ltd., Shanghai (CN)

( * ) Notice: Subject to any disclaimer, the term of this patent is extended or adjusted under 35 U.S.C. 154(b) by 178 days.

(21) Appl. No.: 18/241,452

(22) Filed: Sep. 1, 2023

(65) Prior Publication Data

US 2025/0008665 A1     Jan. 2, 2025

(30) Foreign Application Priority Data

Jun. 28, 2023    (CN) .......................... 202310779865.1

(51) Int. Cl.
     *H05K 5/10*      (2025.01)
     *H05K 5/02*      (2006.01)

(52) U.S. Cl.
     CPC ............ *H05K 5/10* (2025.01); *H05K 5/0204* (2013.01); *H05K 5/0217* (2013.01); *H05K 5/0247* (2013.01)

(58) Field of Classification Search
     CPC ....................................................... G06F 1/18
     See application file for complete search history.

(56) References Cited

U.S. PATENT DOCUMENTS

2019/0294207 A1*   9/2019   Durant .................... G06F 3/147
2021/0343198 A1*   11/2021   Zhang ...................... G09F 9/37

FOREIGN PATENT DOCUMENTS

CN      215636087 U    1/2022
CN      217899303 U    11/2022

* cited by examiner

*Primary Examiner* — Jerry Wu
(74) *Attorney, Agent, or Firm* — Anova Law Group, PLLC

(57) ABSTRACT

A splicing structure includes a support frame and a plurality of splicing modules. The support frame includes a frame base and an adjustment assembly movably disposed on the frame base, where the adjustment assembly includes a first adjustment structure and a second adjustment structure that move in different directions. A splicing module of the plurality of splicing modules is configured to be detachably connected with a corresponding to-be-spliced structure, where the splicing module is movably disposed on one of the first adjustment structure and the second adjustment structure, while the other one of the first adjustment structure and the second adjustment structure has a driving state and a non-driving state. When the other one of the first adjustment structure and the second adjustment structure moves, touches, and pushes the splicing module, the other one of the first adjustment structure and the second adjusting structure is switched from the non-driving state to the driving state.

19 Claims, 16 Drawing Sheets

SPLICING STRUCTURE AND DISPLAY SCREEN

CROSS-REFERENCE TO RELATED APPLICATION

This disclosure claims the priority of Chinese Patent Application No. 202310779865.1, filed on Jun. 28, 2023, the content of which is incorporated by reference in its entirety.

TECHNICAL FIELD

The present disclosure generally relates to the field of display device technology and, more particularly, relates to a splicing structure and a display screen.

BACKGROUND

With the development of display technology, display devices are developing in a variety of directions. In order to meet the needs of different display devices, the application environment of display screens is becoming more and more complex and diverse. For example, under certain circumstances, display screens need to be split to display different views. Under some other circumstances, all areas of a display screen need to display a same view, and thus splicing screens become necessary.

Most of the current splicing screens install and fix multiple sub-screens on a support frame. When one of the sub-screens is damaged, the damaged sub-screen needs to be snapped off to replace it with a new sub-screen. Because the gap between the sub-screens is extremely small, when the damaged sub-screen is snapped off, the stress may be transmitted to the sub-screens adjacent to the damaged sub-screen, resulting in damage to the adjacent sub-screens. This not only increases the workload of replacing a sub-screen, but also easily causes damage to other sub-screens, leading to the increased cost.

In other words, existing splicing screens have problems as the sub-screens included therein are not easy to replace and maintain.

SUMMARY

One aspect of the present disclosure provides a splicing structure. The splicing structure includes a support frame and a plurality of splicing modules. The support frame includes a frame base and an adjustment assembly movably disposed on the frame base, where the adjustment assembly includes a first adjustment structure and a second adjustment structure that move in different directions. A splicing module of the plurality of splicing modules is configured to be detachably connected with a corresponding to-be-spliced structure, where the splicing module is movably disposed on one of the first adjustment structure and the second adjustment structure, while the other one of the first adjustment structure and the second adjustment structure has a driving state and a non-driving state. When the other one of the first adjustment structure and the second adjustment structure moves, touches, and pushes the splicing module, the other one of the first adjustment structure and the second adjusting structure is switched from the non-driving state to the driving state. When the other one of the first adjustment structure and the second adjustment structure moves away from the splicing module, the other one of the first adjustment structure and the second adjustment structure keeps in the non-driving state.

Another aspect of the present disclosure provides a display screen. The display screen includes a splicing structure and a plurality of sub-screens. The splicing structure includes a support frame and a plurality of splicing modules. The support frame includes a frame base and an adjustment assembly movably disposed on the frame base, where the adjustment assembly includes a first adjustment structure and a second adjustment structure that move in different directions. A splicing module of the plurality of splicing modules is configured to be detachably connected with a corresponding to-be-spliced structure, where the splicing module is movably disposed on one of the first adjustment structure and the second adjustment structure, while the other one of the first adjustment structure and the second adjustment structure has a driving state and a non-driving state. When the other one of the first adjustment structure and the second adjustment structure moves, touches, and pushes the splicing module, the other one of the first adjustment structure and the second adjusting structure is switched from the non-driving state to the driving state. When the other one of the first adjustment structure and the second adjustment structure moves away from the splicing module, the other one of the first adjustment structure and the second adjustment structure keeps in the non-driving state. The plurality of sub-screens are correspondingly connected to the plurality of splicing modules of the splicing structure.

BRIEF DESCRIPTION OF THE DRAWINGS

In order to illustrate the technical solutions of the embodiments of the present disclosure more clearly, the accompanying drawings used in the embodiments of the present disclosure shall be briefly introduced below. It should be obvious to those skilled in the art that, other drawings may also be obtained based on these drawings without creative effort.

DETAILED DESCRIPTION

Figure 1:
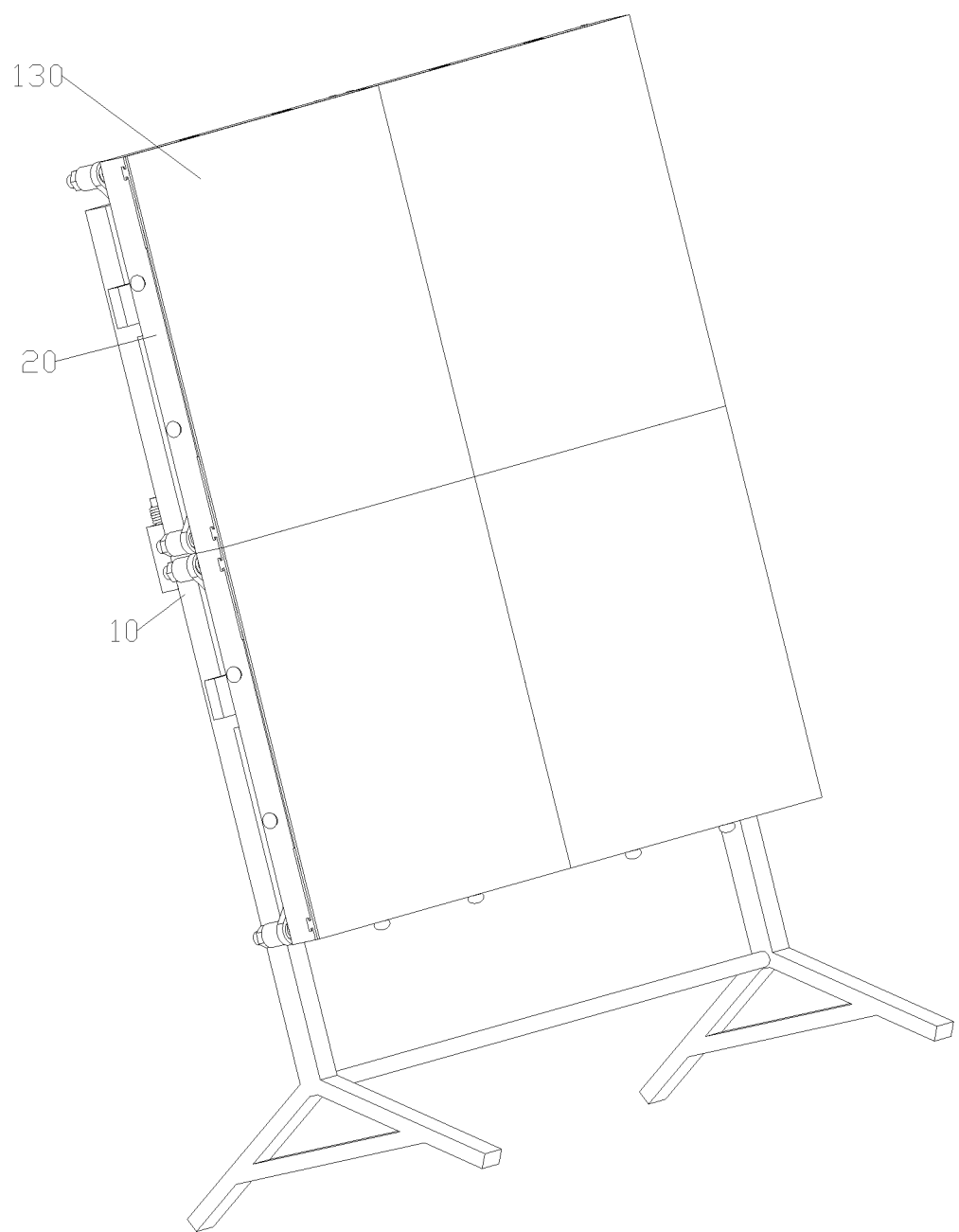
FIG. 1 shows a schematic diagram of the overall structure of a display screen, according to some embodiments of the present disclosure.
Figure 2:
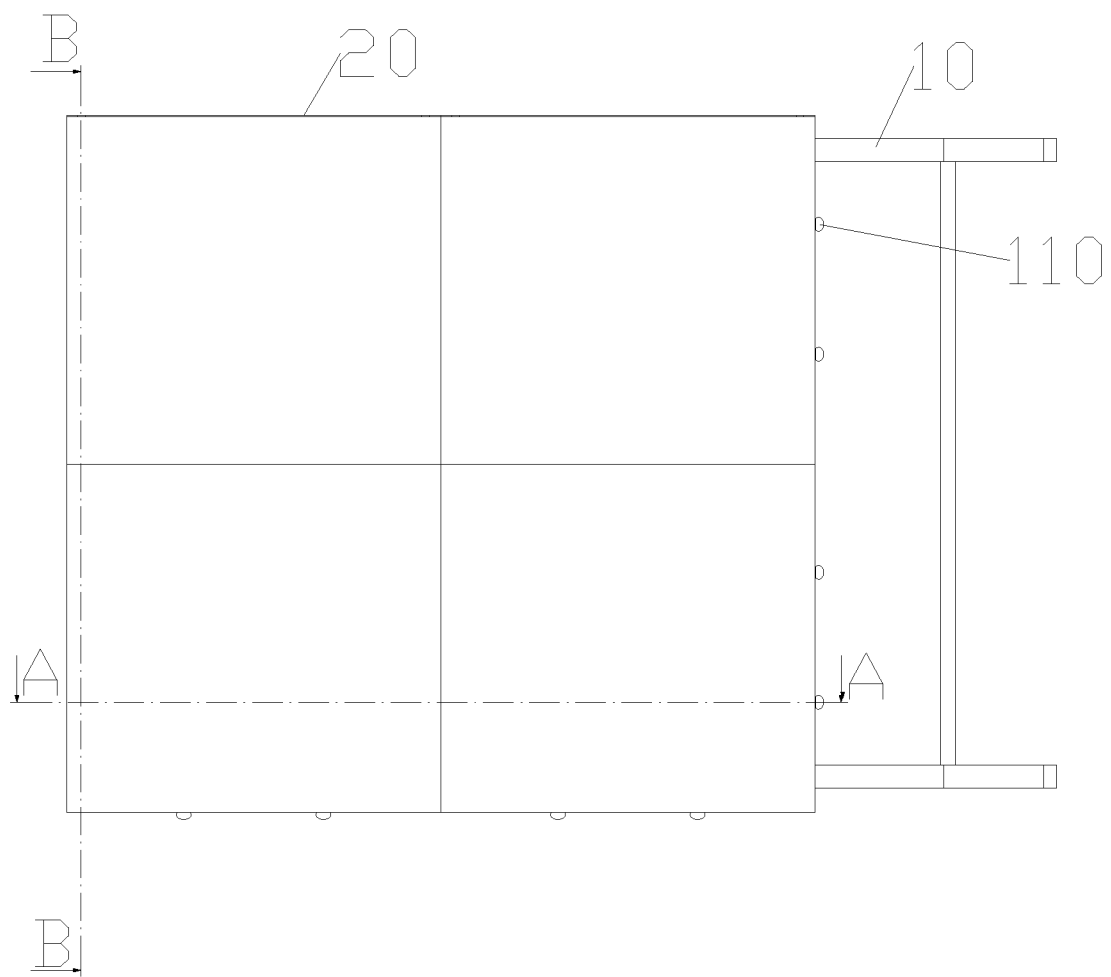
FIG. 2 shows an angled view of the display screen in FIG. 1, according to some embodiments of the present disclosure.
Figure 3:
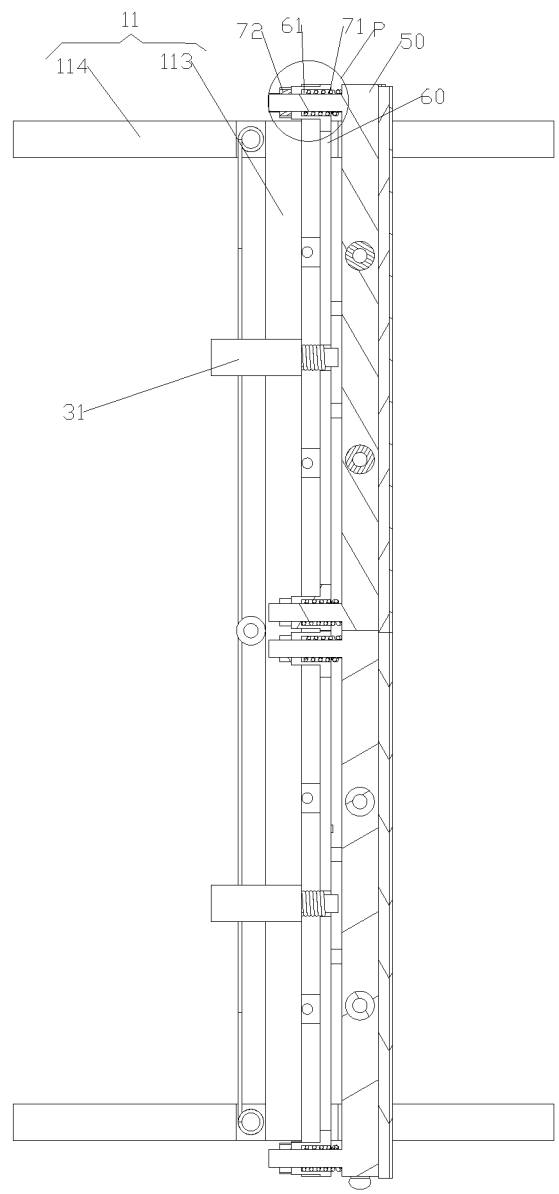
FIG. 3 shows a B-B direction view in FIG. 2, according to some embodiments of the present disclosure.

It should be noted that, in the case of no conflict, the embodiments in the present disclosure and the features in the embodiments can be combined with each other. The present disclosure will be described in detail below with reference to the accompanying drawings and embodiments.

It should be noted that, unless otherwise specified, all technical and scientific terms used in the present disclosure have the same meaning as commonly understood by those of ordinary skill in the art to which this application belongs.

In the present disclosure, the orientation terms such as "up," "down," "top," and "bottom" usually refer to the directions shown in the drawings, or refer to the vertical, perpendicular, or gravitational directions associated with the components themselves. Similarly, for the convenience of understanding and description, "inner" and "outer" refer to the inner and outer parts relative to the outline of each component itself. The above orientation words are not limited in the present disclosure.

To solve the problems that sub-screens are not easy to replace and maintain in the existing splicing screens, the present disclosure provides a splicing structure and a display screen thereof.

As shown in FIGS. 1-7, a display screen disclosed herein includes a splicing structure and a plurality of sub-screens 130. The plurality of sub-screens 130 are respectively connected to a plurality of splicing modules 20 of the splicing structure. The sub-screens 130 included in the display screen containing the splicing structure disclosed herein are easy to replace and maintain. Meanwhile, when a plurality of sub-screens 130 are assembled, the sub-screens are not easy to collide, which effectively increases the production yield of display screens and reduces production costs.

As shown in FIGS. 1 to 21, the splicing structure includes a support frame 10 and a plurality of splicing modules 20. The support frame 10 includes a frame base 11 and an adjustment assembly that is movably disposed on the frame base 11. The adjustment assembly includes a first adjustment structure 12 and a second adjustment structure 13 configured to move in different directions. The plurality of splicing modules 20 are configured for respective detachable connections with the corresponding to-be-spliced structures. A splicing module is movably disposed on one of the first adjustment structure 12 and the second adjustment structure 13, while the other one of the first adjustment structure 12 and the second adjustment structure 13 has a driving state and a non-driving state. When the other one of the first adjustment structure 12 and the second adjustment structure 13 moves, touches, and pushes the splicing module 20, that first adjustment structure 12 or the second adjustment structure 13 switches from the non-driving state to the driving state. When that first adjustment structure 12 or the second adjustment structure 13 is separated from the splicing module 20, the first adjustment structure 12 or the second adjustment structure 13 will be in a non-driving state.

The support frame 10 is configured to support multiple splicing modules 20, facilitating the arrangement of the multiple splicing modules 20 on a same plane. The frame base 11 plays the role of support and fixation, while the adjustment assembly plays the role of adjustment. Since the first adjustment structure 12 and the second adjustment structure 13 are included in the adjustment assembly, the splicing modules 20 can be pushed to move in different directions to adjust the gap between the splicing modules 20, thereby making the splicing process between different splicing modules 20 much easier and also facilitating replacement and repair of a specific splicing module.

Embodiment One

A splicing module 20 is movably disposed on one of the first adjustment structure 12 and the second adjustment structure 13, so that such first adjustment structure 12 or the second adjustment structure 13 drives the splicing module 20 to move in a certain direction. The other one of the first adjustment structure 12 and the second adjustment structure 13 contacts the splicing module 20 when there is a need to drive the splicing module 20 to move, and separates from the splicing module 20 when there is no need to drive the splicing module, thereby reducing interference between the first adjustment structure 12 and the second adjustment structure 13 and ensuring that the two work independently.

It should be noted that, when a to-be-spliced structure on a specific splicing module 20 is damaged, the first adjustment structure 12 and the second adjustment structure 13 can move other splicing modules 20, which may make the gap between the damaged splicing module 20 and other adjacent splicing modules 20 to become larger. This facilitates replacement or repair of the damaged to-be-spliced structure on the splicing module 20, and reduces damage and influence on adjacent structures.

In some embodiments, at least two splicing modules 20 are disposed on one of the first adjustment structure 12 and the second adjustment structure 13, to enable synchronous movement of at least two splicing modules 20 along a same row and/or a same column. This configuration can drive the movement of multiple splicing modules 20 simultaneously, thereby effectively increasing the movement efficiency of the splicing modules 20 and facilitating rapid adjustment of the gap between a to-be-repaired/replaced splicing module 20 and its adjacent splicing modules 20.

In some embodiments, the other one of the first adjustment structure 12 and the second adjustment structure 13 can be configured to simultaneously touch and move away from at least two splicing modules, to enable synchronous movement of at least two splicing modules 20 along a same row and/or a same column. This configuration can drive the movement of multiple splicing modules 20 simultaneously, thereby effectively increasing the movement efficiency of the splicing modules 20 and facilitating rapid adjustment of the gap between a to-be-repaired/replaced splicing module 20 and its adjacent splicing modules 20.

Figure 10:
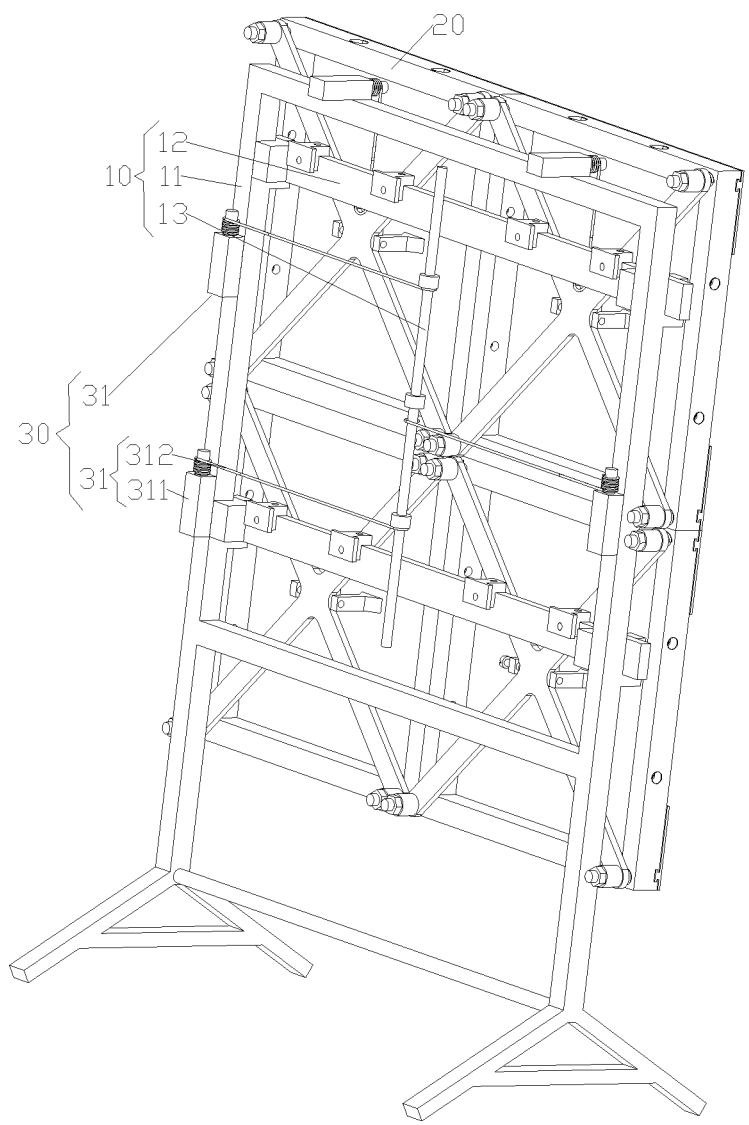
FIG. 10 shows another angled view of the splicing structure in FIG. 8, according to some embodiments of the present disclosure.
Figure 20:
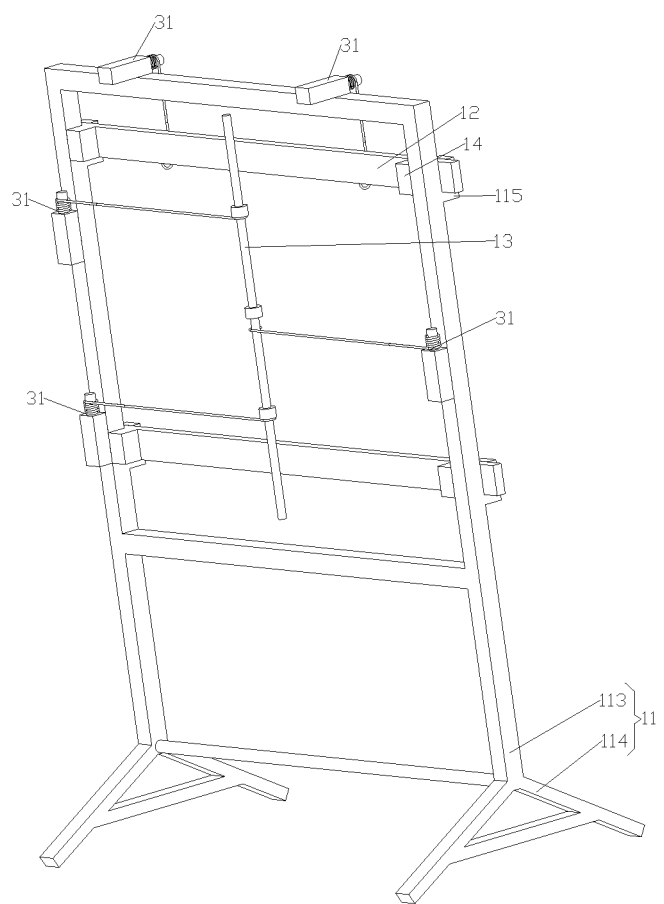
FIG. 20 shows a schematic diagram of the cooperative relationship between the support frame and the drive assembly in FIG. 10, according to some embodiments of the present disclosure.

In the embodiments illustrated in FIGS. 10 and 20, the moving direction of the first adjustment structure 12 is perpendicular to the moving direction of the second adjustment structure 13. The first adjustment structure 12 extends along the first direction, and the extension direction of the first adjustment structure 12 is perpendicular to the moving direction of the first adjustment structure 12. The second adjustment structure 13 extends along the second direction, and the extension direction of the second adjustment structure 13 is perpendicular to the moving direction of the second adjustment structure 13. The first direction is perpendicular to the second direction. The plurality of splicing modules 20 are organized in a matrix format. By configuring the moving direction of the first adjustment structure 12 to be perpendicular to the moving direction of the second adjustment structure 13, it facilitates driving the movement of multiple splicing modules 20 in a same row or same column.

As shown in FIG. 10, the two ends of the first adjustment structure 12 are configured to align with two opposite sides of the frame base 11, so that the first adjustment structure 12 is able to connect with a row of splicing modules 20. The first adjustment structure 12 can thus drive the whole row of splicing modules 20 to move, thereby facilitating adjustment of the gap between adjacent splicing modules 20.

As shown in FIG. 20, the ends of the first adjustment structure 12 are slidably connected with the frame base 11. The first adjusting structure 12 can move relative to the frame base 11 to drive the splicing modules 20 to move, which facilitates adjustment of the gap between adjacent splicing modules 20.

Refer still to FIG. 20, there are multiple first adjustment structures 12, and the plurality of first adjustment structures 12 are aligned along a direction perpendicular to the extension direction of the first adjustment structures 12. Such configuration allows different first adjusting structures 12 to be connected to different rows of splicing modules 20, and thus different first adjusting structures 12 drive different rows of splicing modules 20 to move.

As shown in FIGS. 10 and 20, the splicing structure further includes a driving assembly 30, which is drivingly connected to a first adjustment structure 12 and a second adjustment structure 13 respectively, so as to independently drive a first adjustment structure 12 and a second adjustment structure 13. This configuration allows a first adjustment structure 12 and a second adjustment structure 13 to act independently, so as to independently drive the splicing modules 20 to move, thereby reducing the interference between a first adjustment structure 12 and a second adjustment structure 13.

Figure 11:
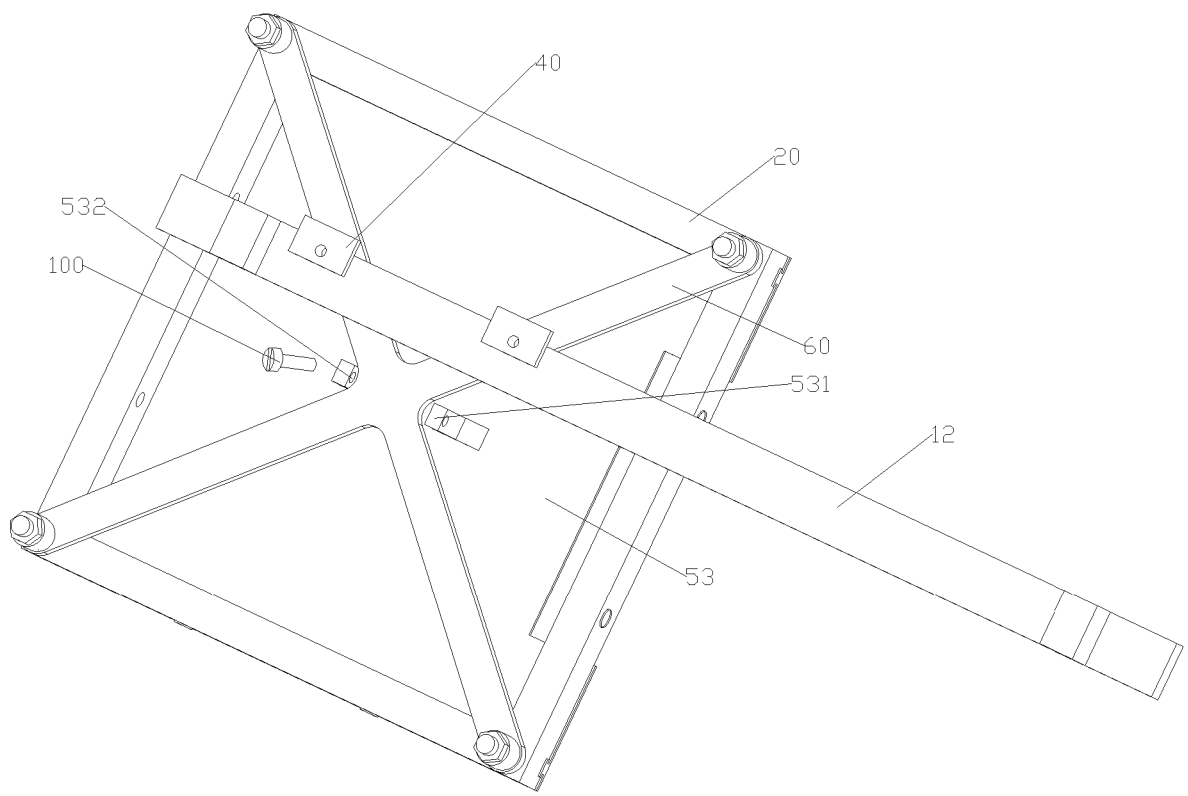
FIG. 11 shows a schematic diagram of the cooperative relationship between the splicing module and the first leveling structure in FIG. 10, according to some embodiments of the present disclosure.

As shown in FIGS. 10 and 11, a splicing module 20 has a mounting bracket 40 on the side facing the support frame 10. The mounting bracket 40 is mounted onto a first adjustment structure 12, and the mounting bracket 40 is configured to slide along the extension direction of the first adjustment structure 12. By configuring a mounting bracket 40 on the splicing module 20, and by slidably connecting the mounting bracket 40 with the first adjustment structure 12, when a second adjustment structure 13 drives a splicing module 20 to move, the mounting bracket 40 slides along the extension direction of the first adjustment structure 12, so as to adjust the gap between splicing modules 20 disposed on a same first adjustment structure 12.

Figure 12:
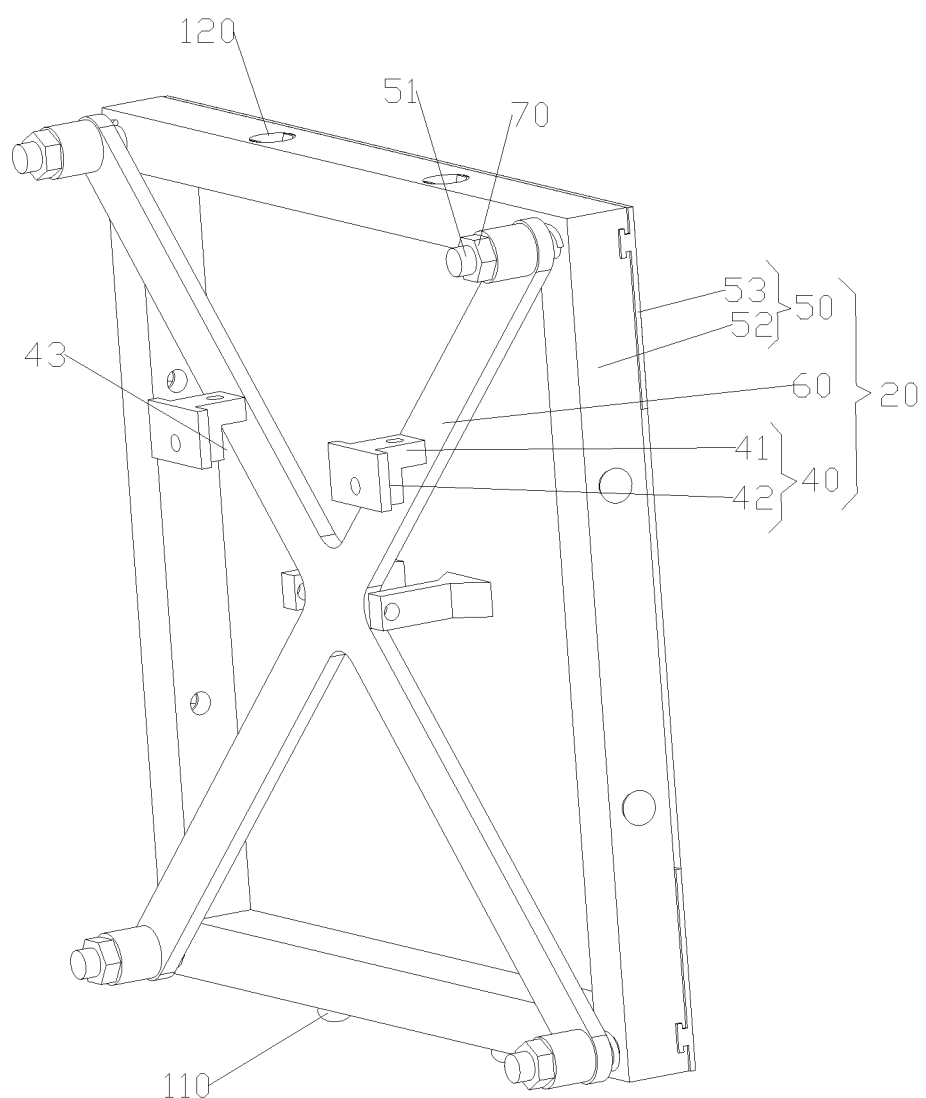
FIG. 12 shows a schematic structural view of the splicing module in FIG. 10, according to some embodiments of the present disclosure.

As shown in FIG. 12, a mounting bracket 40 includes a first plate segment 41 and a second plate segment 42 that is bent to form an angle. The first plate segment 41 and the second plate segment 42 form a mounting region 43, and a first adjustment structure 12 is fitted into the mounting region 43. The first plate segment 41 and the second plate segment 42 configured to have an angle can act on a first adjustment structure 12 in two directions, thereby limiting the first adjustment structure 12 to remain in the mounting region 43. Such configuration reduces the risk of a mounting bracket 40 separating from a first adjustment structure 12, thereby ensuring the stable connection between the mounting bracket 40 and the first adjustment structure 12.

Figure 15:
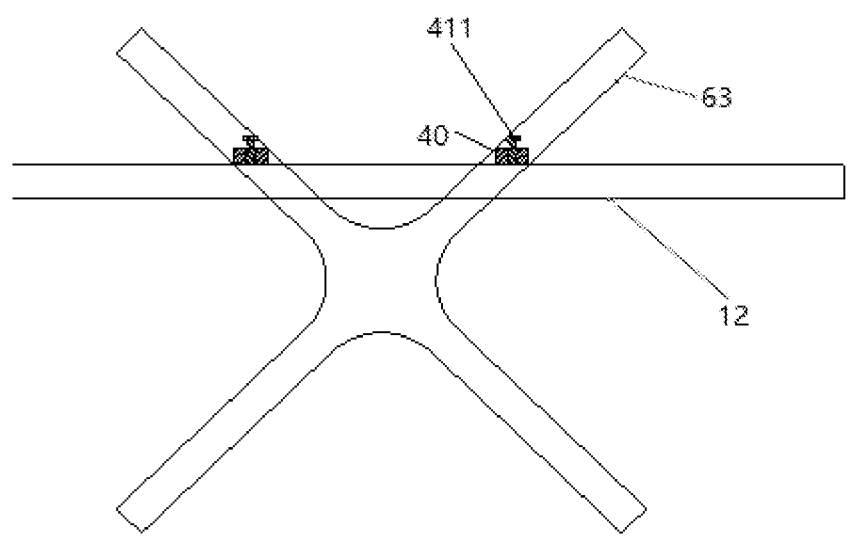
FIG. 15 shows a schematic diagram of the cooperative relationship between the first adjustment structure and the adjustment frame in FIG. 12, according to some embodiments of the present disclosure.
Figure 18:
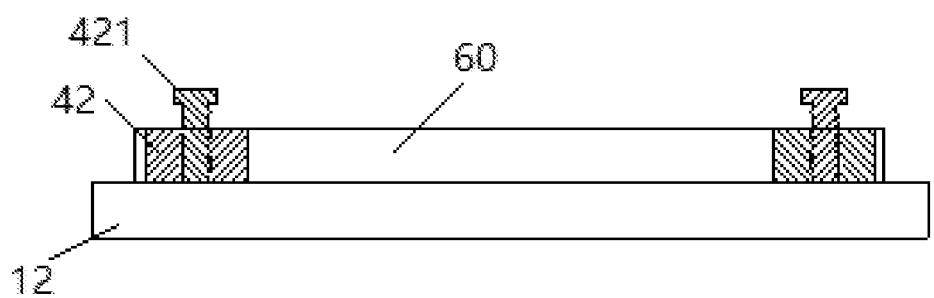
FIG. 18 shows a schematic diagram of an adjustment state of the first adjustment structure and the second leveling structure in FIG. 15, according to some embodiments of the present disclosure.

As shown in FIGS. 12, 15, and 18, at least two mounting brackets 40 are disposed on a single splicing module 20. A first leveling structure 411 is disposed on the first plate segment 41 of each mounting bracket 40, and a second leveling structure 421 is disposed on the second plate segment 42 of each mounting bracket 40. The first leveling structure 411 and the second leveling structure 421 are configured to adjust the flatness of a splicing module 20 in different directions. The flatness of a splicing module 20 can be adjusted in different directions by adjusting the first leveling structure 411 and the second leveling structure 421. This allows the adjustment of a plurality of to-be-spliced structures on the plurality of splicing modules 20 to be in a same plane, so as to make the splicing screen have a better flatness.

Optionally, one of the first leveling structure 411 and the second leveling structure 421 is configured to adjust the tilt angle of a splicing module 20 in the vertical direction, while the other of the first leveling structure 411 and the second leveling structure 421 is configured to adjust the surface flatness of a splicing module 20 on a side away from the frame base 11.

Figure 16:
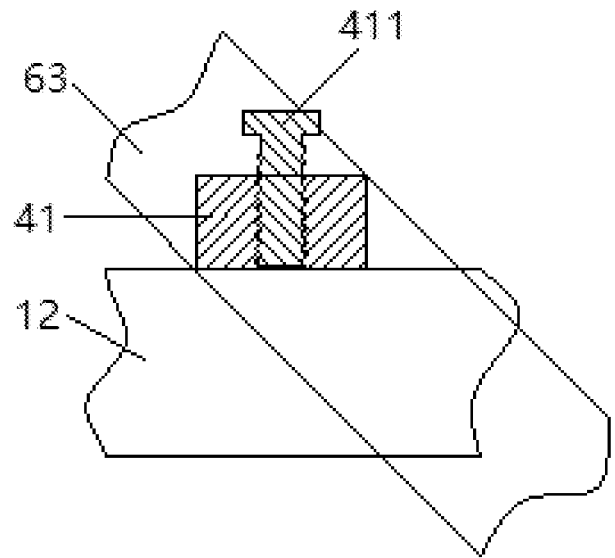
FIG. 16 shows a schematic diagram of an adjustment state of the first adjustment structure and the first leveling structure in FIG. 15, according to some embodiments of the present disclosure.
Figure 17:
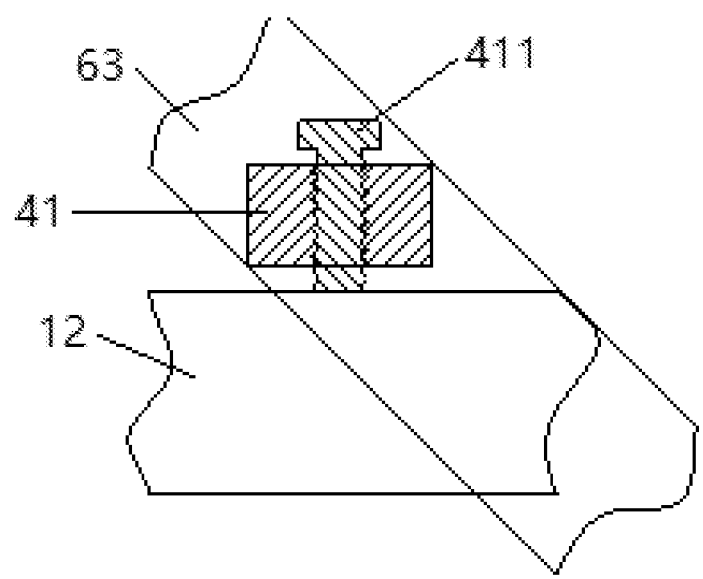
FIG. 17 shows a schematic diagram of another adjustment state of the first adjustment structure and the first leveling structure in FIG. 15, according to some embodiments of the present disclosure.

As shown in FIGS. 16 and 17, the first plate segment 41 and the second plate segment 42 are configured to include adjustment holes. The first leveling structure 411 includes a first adjustment screw inserted into the adjustment hole of the first plate segment 41. An end of the first adjustment screw abuts against a first location on the surface of the first adjustment structure 12. By adjusting the depths, of two first adjusting screws on two mounting brackets 40, screwed into the adjustment holes, the tilt angle of a splicing module 20 in the vertical direction is adjusted From the comparison of FIGS. 16 and 17, it can be seen that by rotating the first adjustment screw to make the bottom of the first adjustment screw abut against the first adjustment structure 12, a further rotation of the screw may gradually tilt a connection arm 63 to the right, so as to adjust the tilt angle of the splicing module 20 in the vertical direction.

Figure 19:
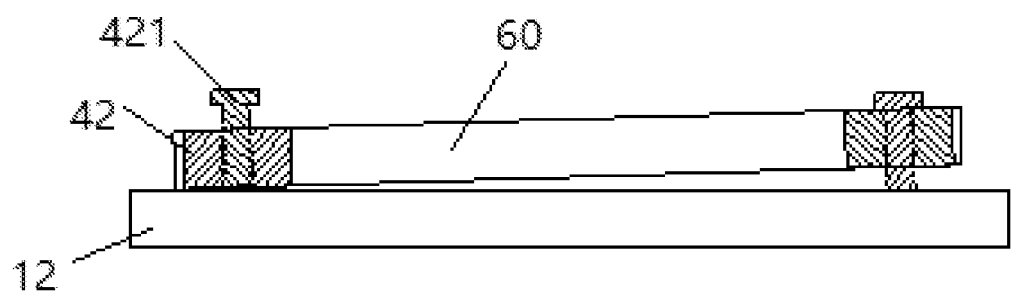
FIG. 19 shows a schematic diagram of another adjustment state of the first adjustment structure and the second leveling structure in FIG. 15, according to some embodiments of the present disclosure.

As shown in FIGS. 18 and 19, a second leveling structure 421 includes a second adjustment screw inserted into the adjustment hole of the second plate segment 42. An end of the second adjustment screw abuts against a second location on the surface of the first adjustment structure 12. The flatness of the surface of a splicing module 20 on a side away from the frame base 11 is adjusted by adjusting the depths, of the two second adjusting screws on two mounting brackets 40, screwed into the adjustment holes.

From the comparison of FIGS. 18 and 19, it can be seen that through rotating the second adjustment screw to make the bottom of the second adjustment screw abut against the first adjustment structure 12, the distance between the right end of the adjustment frame 60 and the first adjustment structure 12 gradually increases, while the distance between the left end of the adjustment frame 60 and the first adjustment structure 12 remains unchanged. Thus, the orientation in a direction perpendicular to a splicing module 20 is adjusted to adjust the flatness of a splicing module 20.

Figure 13:
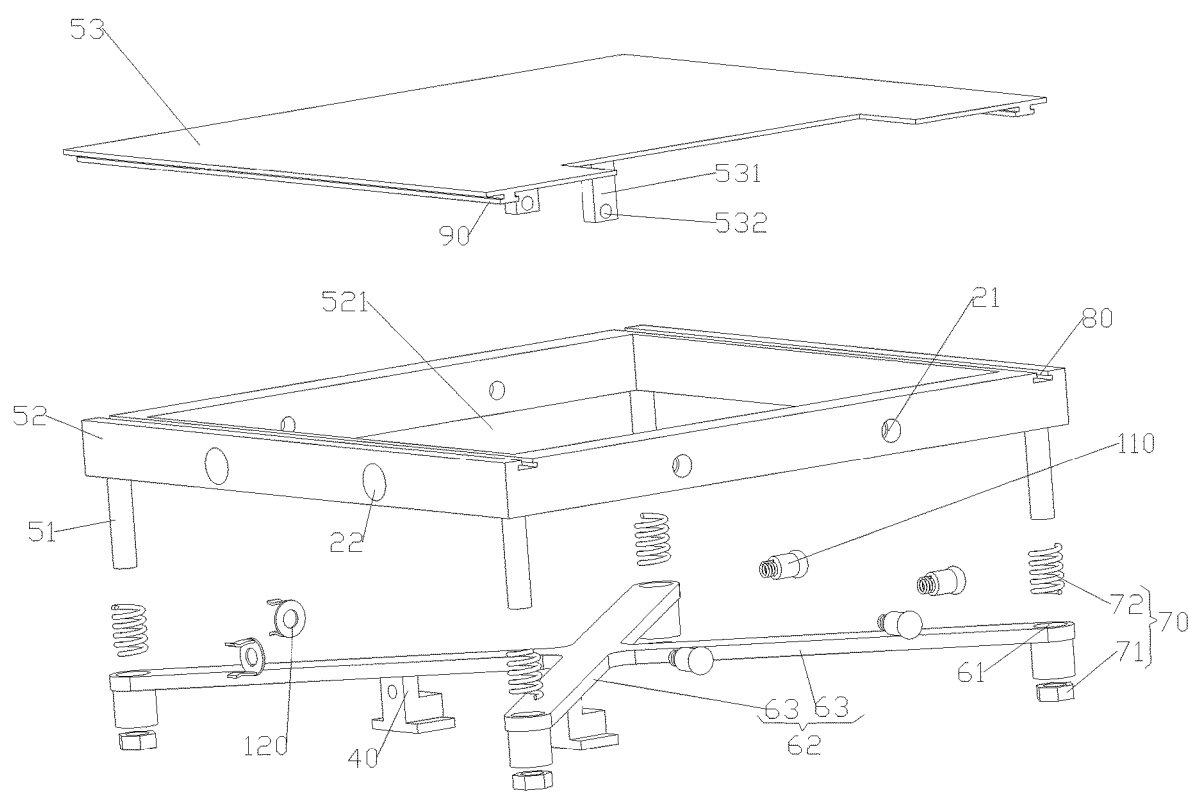
FIG. 13 shows an exploded view of the splicing module in FIG. 12, according to some embodiments of the present disclosure.

As shown in FIGS. 12 and 13, a splicing module 20 includes a splicing assembly 50, an adjustment frame 60, and an adjustment unit 70. A to-be-spliced structure is detachably disposed on the splicing assembly 50, which includes at least three non-collinear connection parts 51. The adjustment frame 60 is disposed on a side of the splicing assembly 50 facing the support frame 10, and has a mounting bracket 40 for loading a first adjustment structure 12 and a second adjustment structure 13. The adjustment frame 60 also has a plurality of mounting ports 61 for one-to-one mounting of the connection parts 51. The adjustment unit(s) 70 includes more than one unit, which are disposed at the plurality of mounting ports 61 and adjustably connected with the connection parts 51, to adjust the flatness of the splicing assembly 50. At least three non-collinear connection parts 51 are respectively connected to the mounting ports 61 inside the adjustment frame 60. By adjusting an adjustment unit 70 to adjust the relative position between a connection part 51 and a mounting port 61, the flatness of the splicing assembly 50 is adjusted.

The flatness of each splicing module 20 is adjustable. In order to deal with the deviation generated during the manufacturing of a splicing module 20 or a to-be-spliced structure, the flatness of a splicing module 20 can be adjusted based on the needs, so that a structure after the splicing has an optimal flatness.

Figure 4:
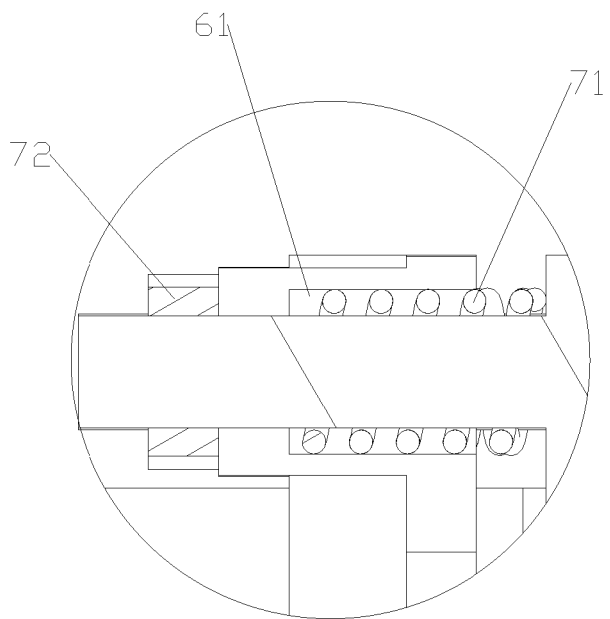
FIG. 4 shows an enlarged view of part P in FIG. 3, according to some embodiments of the present disclosure.
Figure 5:
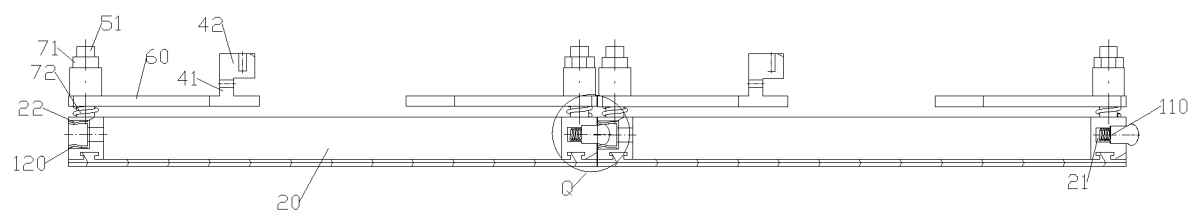
FIG. 5 shows an A-A direction view in FIG. 2, according to some embodiments of the present disclosure.

As shown in FIGS. 4 and 13, the adjustment frame 60 has an adjustment through hole, which can be used as a mounting port 61. A connection part 51 can be a connection pole, and an adjustment unit 70 includes an elastic part 71 and a fastening nut 72. An elastic part 71 is sleeved on the connection pole and abuts against both the splicing assembly 50 and the adjustment frame 60. The portion of a connection pole after passing through an adjustment through hole is affixed to a fastening nut 72, to press the fastening nut 72 against the adjustment frame 60. By adjusting the fastening nut 72, the length of the connection part 51 into the fastening nut 72 can be adjusted to adjust the distance between the splicing assembly 50 and the adjustment frame 60 at this position. Meanwhile, the elastic part 71 is able to stably support the splicing assembly 50.

In some embodiments, an elastic part is a spring.

In the embodiment illustrated in FIG. 4, the adjustment through hole is a stepped hole. The connection part 51 extends through the stepped hole. The elastic part 71 is sleeved on the connection part 51. Part of the elastic part 71 lies within the larger portion of the stepped hole and abuts against the step in the stepped hole. The other end of the elastic part 71 abuts against the splicing assembly 50 to form a support for the splicing assembly 50.

Figure 14:
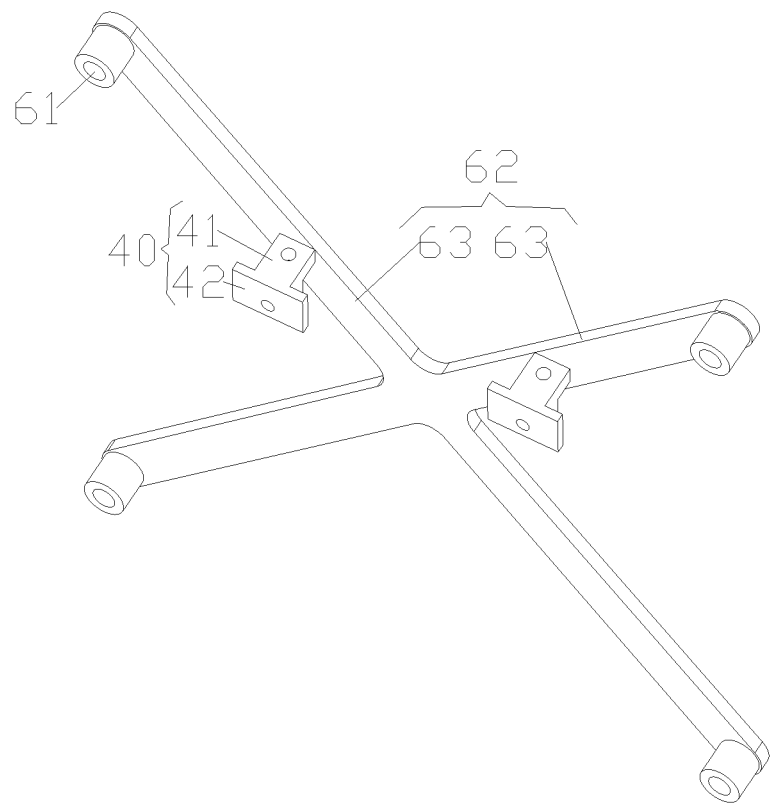
FIG. 14 shows a schematic structural view of the adjustment frame in FIG. 13, according to some embodiments of the present disclosure.

As shown in FIGS. 13 and 14, the adjustment frame 60 also includes a frame body 62.

The frame body 62 includes the mounting ports 61, and has at least three connection arms 63. The multiple connection arms 63 are jointed at one end. A mounting port 61 and a mounting bracket 40 are disposed on a connection arm 63 at intervals. The first ends of the connection arms 63 are joined together, while the second ends of the connection arms 63 protrude in different directions to connect with the splicing assembly 50 at different positions.

In the embodiment illustrated in FIG. 14, the frame body 62 is X-shaped. That is, the frame body 62 has four connection arms 63, which form an X-shaped frame body 62.

In the embodiment illustrated in FIG. 14, the plurality of mounting ports 61 are configured in a one-to-one correspondence within the plurality of connection arms 63. A mounting port 61 is disposed at the second end of a connection arm 63. This configuration allows the frame body 62 to connect with the splicing assembly 50 in different positions and along different directions, to ensure a stable connection between the frame body 62 and the splicing assembly 50.

In the embodiment illustrated in FIG. 14, a mounting bracket 40 is disposed between the first and second ends of a connection arm 63. The mounting bracket 40 is closer to the middle point of the frame body 62, which facilitates a splicing module 20 to remain in a balanced state when the first adjustment structure 12 and the second adjustment structure 13 drive the splicing module 20 to move, and prevents the splicing module 20 from inclined movements to interfere with other splicing modules 20.

As shown in FIG. 13, the splicing assembly 50 includes a leveling frame 52 and a support board 53. The leveling frame 52 includes a central opening area 521 and a plurality of connection parts 51. The plurality of connection parts 51 are disposed at intervals along a circumferential edge of the central opening area 521. The support board 53 is disposed on a side of the leveling frame 52 away from the adjustment frame 60. A to-be-spliced structure is connected to a surface of the support board 53 on a side away from the leveling frame 52. The leveling frame 52 may be a rectangular frame, and the connection parts 51 are disposed at the four corners of the rectangular frame. The support board 53 is connected with the leveling frame 52, and is disposed as a cover of the central opening area 521.

As shown in FIG. 13, one of the leveling frame 52 and the support board 53 has a slide 80, while the other one of the leveling frame 52 and the support board 53 has a slider 90, which can be slidably placed within the slide 80. The support board 53 may slide against the leveling frame 52, to facilitate the assembly/disassembly of the support board 53 and the leveling frame 52. After the assembly of the to-be-spliced structure with the support board 53, the support board 53 and the leveling frame 52 are put together.

Figure 8:
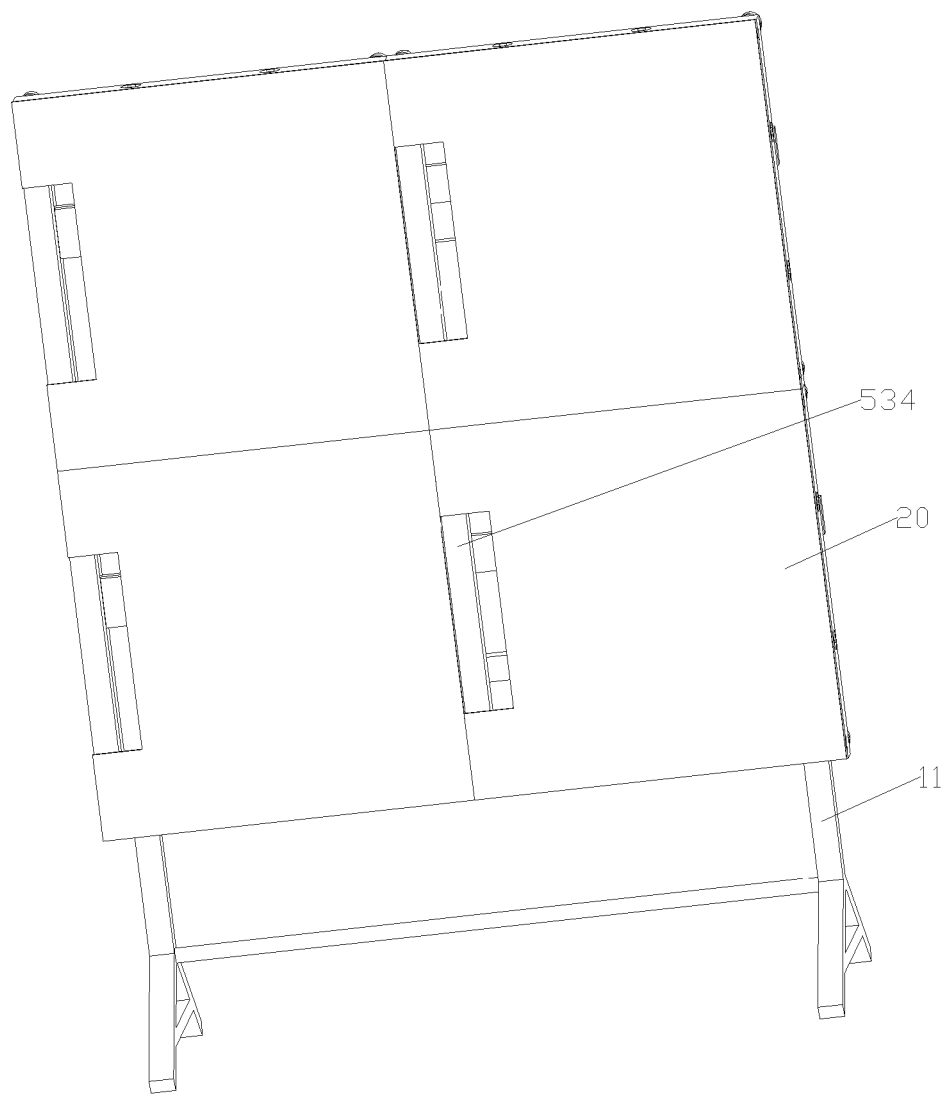
FIG. 8 shows a schematic diagram of the overall structure of a splicing structure in Embodiment One of the present disclosure.
Figure 9:
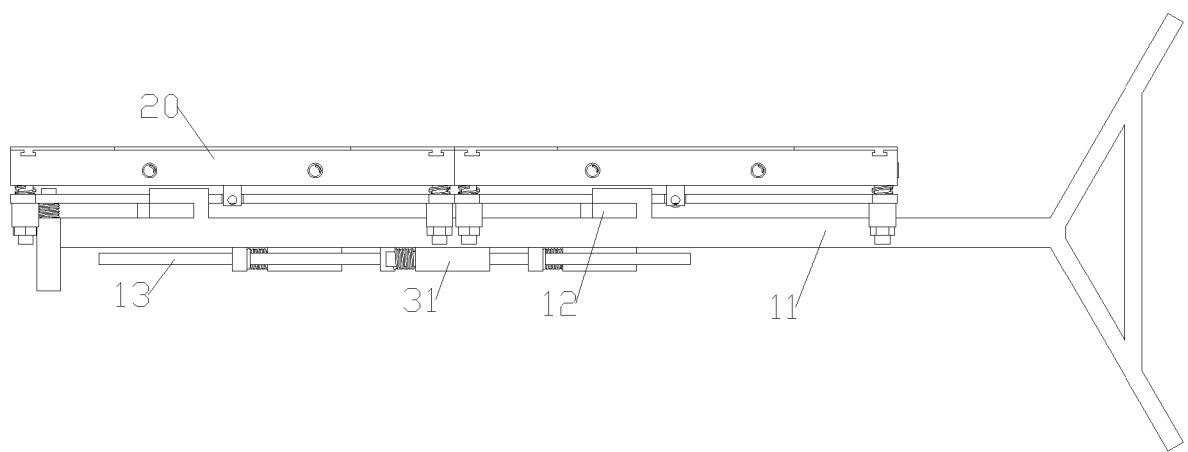
FIG. 9 shows an angled view of the splicing structure in FIG. 8, according to some embodiments of the present disclosure.

In the embodiment illustrated in FIG. 8, the support board 53 is provided with a recessed part 534, which is used to provide hiding space for a protruding structure on a to-be-spliced structure. The protruding structure may be a flexible circuit board, which is not limited in the disclosure. The recessed part may be designed based on whether a to-be-spliced structure includes a protruding structure, and the shape of the recessed part 534 may match the protruding structure.

As shown in FIG. 11, a splicing module 20 also includes a third adjustment screw 100. On the side facing the leveling frame 52, the surface of the support board 53 includes at least two adjustment lugs 531 that are spaced apart. An adjustment lug 531 has a third adjustment hole 532. The adjustment frame 60 is located between two adjustment lugs

531. A third adjustment screw 100 passes through a third adjustment hole 532 to abut against the adjustment frame 60. This configuration allows to adjust the tilt angle of the support board 53 by adjusting the depth that a third adjustment screw 100, located between the two adjustment lugs 531, passes through am adjustment lug 531. This facilitates the adjustment of the support board 53 for the plurality of splicing modules 20 to make these splicing modules even and flat, thereby avoiding the influence of the variation caused by the support board 53 fabricaiton process.

In some embodiments, a metal material having a thermal expansion coefficient similar to that of a to-be-spliced structure is selected for the support board 53, to provide good support and heat dissipation.

As shown in FIGS. 3-6, at least one of a first anti-collision connector 110 and a second anti-collision connector 120 is provided on the side wall of a splicing module 20. A first anti-collision connector 110 on a splicing module 20 is connected with a second anti-collision connector 120 of an adjacent splicing module 20 through a snap fit connection. By placing the first anti-collision connector 110 and/or the second anti-collision connector 120 on the side wall of the splicing modules 20, the opportunity that two adjacent splicing modules 20 collide during an assembly/disassembly process is reduced, and the risk that a to-be-spliced structure is damaged during the splicing module 20 assembling process is reduced.

Figure 6:
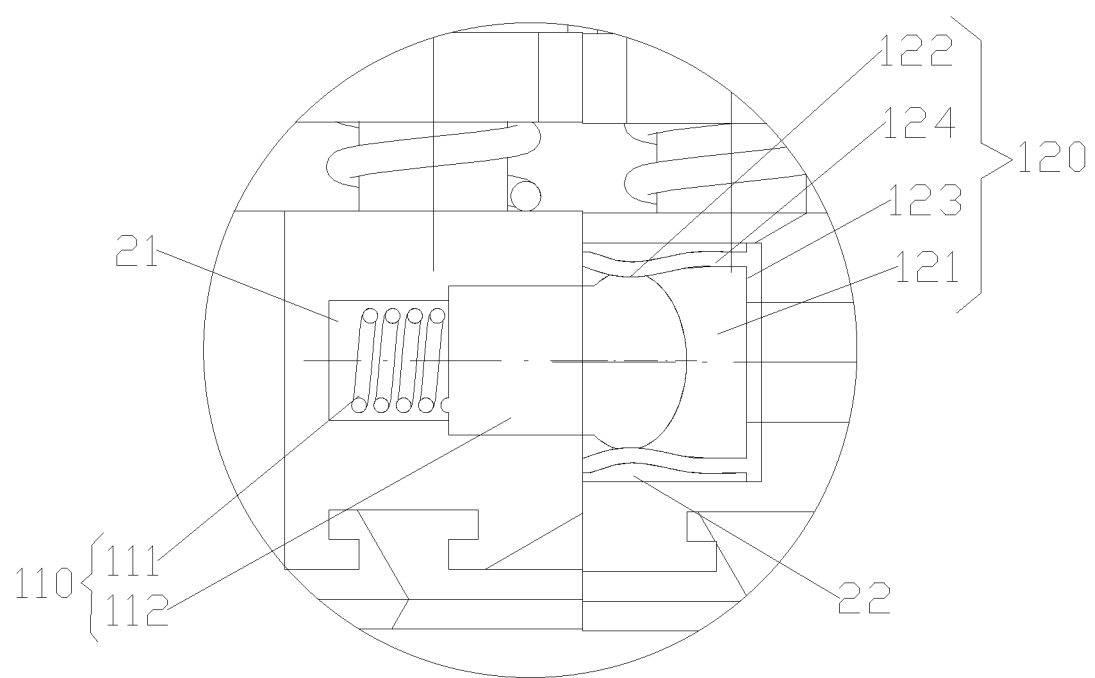
FIG. 6 shows an enlarged view of part Q in FIG. 5, according to some embodiments of the present disclosure.

In the embodiment illustrated in FIG. 6, the side wall of a splicing module 20 also includes a first mounting groove 21 for mounting the first anti-collision connector 110 and a second mounting groove 22 for mounting the second anti-collision connector 120. The first anti-collision connector 110 is disposed within the first mounting groove 21 in a stretchable manner. By stretchably disposing the first anti-collision connector in the first mounting groove 21, the first anti-collision connector 110 has a certain buffer capacity, thereby reducing the impact force between the splicing modules 20 and preventing a splicing module 20 from collision or compression during a splicing process.

In the embodiment illustrated in FIG. 6, the first mounting groove 21 is a stepped groove. A first anti-collision connector 110 includes an elastic portion 111 and a snap fit connection portion 112. One end of the elastic portion 111 is connected with the groove bottom surface of the first mounting groove 21, and the other end of the elastic portion 111 is connected with the snap fit connection portion 112. At least a portion of the snap fit connection portion 112 is located outside the first mounting groove 21, and the snap fit connection portion 112 is connected with a second anti-collision connector 120 through a snap fit connection. The elastic portion 111 has certain elasticity to provide a buffer capacity for the snap fit connection portion 112, thereby reducing the collision and compression during the connection of the snap fit connection portion 112 with the second anti-collision connector 120. This allows a faster assembly of multiple splicing modules 20.

In the embodiment illustrated in FIG. 6, the first mounting groove 21 is a stepped groove. The stepped groove includes a small diameter section and a large diameter section. The connection point of the small diameter section and the large diameter section forms a step. The elastic portion 111 is located within the small diameter section, while the snap fit connection portion 112 is located in the large diameter section. The step limits the movement of the snap fit connection portion 112. That is, the outer diameter of the snap fit connection portion 112 is greater than the inner diameter of the small diameter section. This prevents the snap fit connection portion 112 from entering into the small diameter section, so that the snap fit connection portion 112 is anti-collision. An elastic snap fit connection cavity 121 can be deformed, to allow it to connect with the snap fit connection portion 112. After connection, the snap fit connection portion 112 may have a certain displacement in the elastic snap fit connection cavity 121. At this moment, the elastic portion 111 is stretched, which then provides the necessary force between adjacent splicing modules 20, to reduce the seam problems caused by thermal expansion and contraction.

As shown in FIG. 6, a second anti-collision connector 120 has an elastic snap fit connection cavity 121, where the cavity wall of the elastic snap fit connection cavity 121 has a raised abutting surface segment 122 for docking with the first anti-collision connector 110. The raised abutting surface segment 122 of the elastic snap fit connection cavity 121 abuts against the first anti-collision connector 110, so as to connect the snap fit connection portion 112 of the first anti-collision connector 110 with the raised abutting surface segment 122 through the snap fit connection. This reduces the risk of the detachment of the first anti-collision connector 110 from the second anti-collision connector 120 and ensures a tight connection between the first anti-collision connector 110 and the second anti-collision connector 120.

In the embodiment illustrated in FIG. 6, the second anti-collision connector 120 includes a snap fit connection baseboard 123 and at least two snap fit connection arms 124. The snap fit connection baseboard 123 contacts the groove bottom surface of the second mounting groove 22, and the elastic snap fit connection cavity 121 is formed between the at least two snap fit connection arms 124. A snap fit connection arm 124 has a raised abutting surface segment 122. The snap fit connection baseboard 123 and the groove bottom surface of the second mounting groove 22 are connected by screws to prevent the detachment of the second anti-collision connector 120 from the second mounting groove 22. Meanwhile, the first anti-collision connector 110 can move within the elastic snap fit connection cavity 121, ensuring the stability of the connection of the second anti-collision connector 120 with the second mounting groove 22. A snap fit connection arm 124 is connected with the snap fit connection portion 112 through a snap fit connection, which facilitates the rapid assembly/disassembly of the first anti-collision connector 110 and the second anti-collision connector 120 while ensuring a tight connection between the first anti-collision connector 110 and the second anti-collision connector 120.

Figure 7:
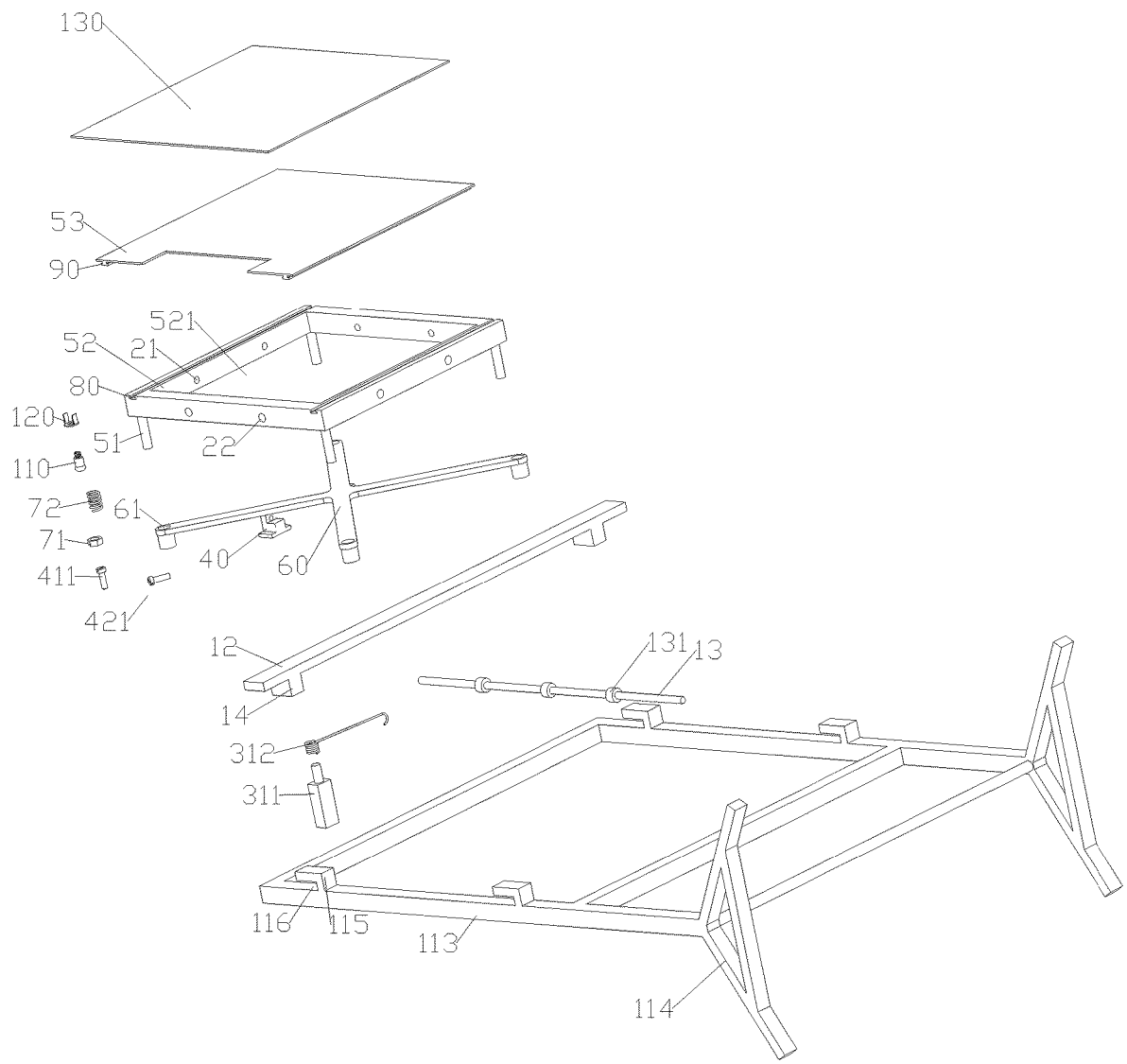
FIG. 7 shows an exploded view of a part of the structure of the display screen in Embodiment One of the present disclosure.

As shown in FIGS. 7 and 20, on a side away from the splicing module 20, a first adjustment structure 12 includes at least two position-limit bumps 14. The position-limit bumps are located at the inner side of the frame base 11 and together with a side of the frame base 11 form position limits, to limit the range of movement of the splicing module 20. A position-limit bump 14 together with the frame base 11 limit the movement range of the first adjustment structure 12, which limits the first adjustment structure 12 to move in the second direction but not in the first direction. Accordingly, when the second adjustment structure 13 drives a splicing module to move, the first adjustment structure does not move at the same time. This helps the second adjustment structure 13 drive a splicing module 20 disposed on the first adjustment structure 12.

In the embodiment illustrated in FIG. 20, the frame base 11 includes a rectangular frame 113 and at least two supporting legs 114. The supporting legs 114 are spaced apart below the rectangular frame 113 to support the rectangular frame 113. The first adjustment structure 12 is movably disposed on the rectangular frame 113. A side surface of the rectangular frame 113 has a plurality of groups of support assemblies disposed along the moving direction of the first adjustment structure 12. A support assembly includes at least two support hooks 115 disposed along the moving direction of the second adjustment structure 13. The support hooks 115 are respectively affixed to the rectangular frame 113.

In the embodiment illustrated in FIG. 7, a support hook 115 is formed by connecting two angled support posts, one of which is connected to the rectangular frame 113, and the other is spaced apart from the rectangular frame 113 to form a support groove 116. The support groove 116 opens up to allow the first adjustment structure 12 to move in a vertical direction.

As shown in FIG. 20, the driving assembly 30 includes a plurality of driving elements 31. A driving element includes a driving motor 311 and a hooked rope 312 (i.e., a rope with hooks). The driving motor 311 is disposed on the frame base 11. One end of the hooked rope 312 is connected to the driving motor 311, and the other end of the hooked rope 312 is connected to the first adjustment structure 12 or the second adjustment structure 13. The driving motor 311 is disposed on the rectangular frame 113, and the hooked rope 312 is connected to the first adjustment structure 12 or the second adjustment structure 13. When the driving motor 311 rotates, the hooked rope 312 retracts to drive the first adjustment structure 12 or the second adjustment structure 13 to move.

As shown in FIG. 20, at least one driving element 31 is disposed at the top of the frame base 11, and the hooked rope 312 of the driving element 31 is detachably connected to the first adjustment structure 12. The driving element 31 rotates to drive the hooked rope 312 to retract, to drive the first adjustment structure 12 to move upward. Thus, the first adjustment structure 12 drives the splicing module 20 to move upward, to increase the distance between adjacent two rows of splicing modules 20. When splicing modules 20 need to be installed to the frame base 11, the hooked rope 312 may be detached from the first adjustment structure 12, and the row of the splicing modules 20 on the first adjustment structure 12 may be manually mounted to the frame base 11.

As shown in FIG. 20, hooked ropes 312 of at least three driving elements 31 are connected to the second adjustment structure 13. The pulling direction of two hooked ropes 312 of the three hooked ropes 312 is opposite to the pulling direction of the remaining third hooked rope 312 and is perpendicular to the extension direction of the second adjustment structure 13, so that the second adjustment structure 13 is suspended at the frame base 11. At least three driving elements 31 drive the second adjustment structure 13 to move in the horizontal direction. In addition, it is necessary to ensure that the forces on two sides of the second adjustment structure 13 are balanced so that the second adjustment structure does not tilt. When the second adjustment structure 13 needs to drive splicing modules 20 to move, it is necessary to move the second adjustment structure 13 towards the mounting bracket 40. In addition, based on the needs, the second adjustment structure 13 may be chosen to abut against a single mounting bracket 40 or a column of mounting brackets 40, so that the second adjustment structure 13 drives a single splicing module 20 or a column of splicing modules 20 to move.

In the embodiment illustrated in FIG. 20, the three hooked ropes 312 are connected to the second adjustment structure 13. Two hooked ropes 312 pull the second adjustment structure 13 in a same direction, while the remaining third hooked rope 312 pulls the second adjustment structure 13 in the opposite direction, where the third hooked rope 312 is positioned between the two hooked ropes 312 in the vertical direction. This ensures a force balance among the three hooked ropes, thereby suspending the second adjustment structure 13 at the frame base 11.

In the embodiment illustrated in FIG. 7, the second adjustment structure 13 has a plurality of flanged stop collars 131 that are spaced apart. The plurality of flanged stop collars 131 are disposed according to the plurality of hooked ropes 312 to limit the movement of the hooked ropes 312 and ensure that each of the hooked ropes 312 is in their respective regions without interference with each other.

A splicing module 20 in the present disclosure has four degrees of freedom in adjustment. Through a connection between the adjustment assembly and a mounting bracket 40 and cooperative actions between a mounting bracket 40 and a first adjustment screw, the adjustment with six degrees of freedom can be further achieved. The side wall of a splicing module 20 is provided with a first anti-collision connector 110 and a second anti-collision connector 120. The first anti-collision connector 110 and the second anti-collision connector 120 cooperate with the first mounting groove 21 and the second mounting groove 22, respectively, so that two adjacent splicing modules 20 have a certain interaction after the splicing, which prevents the seam change caused by the thermal expansion and contraction. A first adjustment structure 12 mounted on the splicing module 20 is able to move, and can cooperate with the second adjustment structure 13 to drive a splicing module 20 to move. This provides a certain gap between a to-be-disassembled splicing module 20 and its adjacent splicing module 20, thereby facilitating the disassembly of the splicing module 20 without damaging other splicing modules.

Embodiment Two

Compared to Embodiment One, the shape of the frame body 62 is different.

Figure 21:
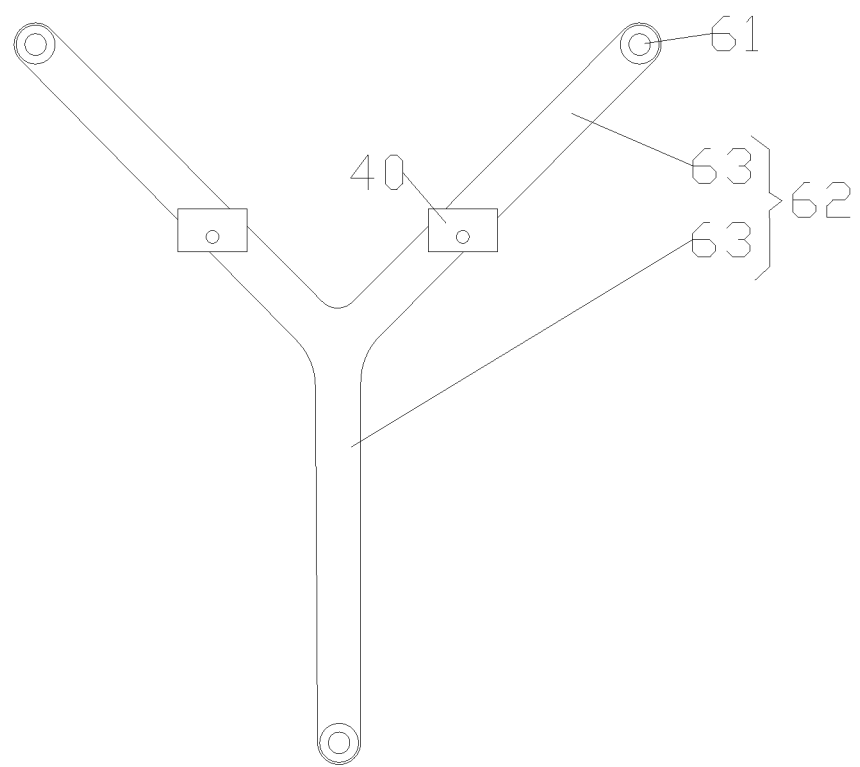
FIG. 21 shows a schematic structural view of the adjustment frame of Embodiment Two of the present disclosure.

In the embodiment illustrated in FIG. 21, the frame body 62 is like a three-blade windmill. In other words, the frame body 62 has three connection arms 63, where the three connection arms 63 are like a windmill.

The leveling frame 52 is a rectangular frame. Two connection parts 61 are disposed at the two corners above the rectangular frame, and the third connection part 61 is disposed at the middle of the plate segment below the rectangular frame, so that the connection parts 61 are connected with connection arms 63.

The two mounting brackets 40 are each disposed on the two connection arms 63 that cooperate with the two connection parts 61 disposed at the two corners.

In the disclosed embodiment, it needs to make sure that the three connection parts 61 are not collinear, so that a plane can be then determined, which facilitates the leveling of the support board 53.

Embodiment Three

Compared to Embodiment One, the position of the elastic part 71 is different. In this embodiment, the aperture size of the adjustment through hole is smaller than the aperture of the elastic part 71, and the elastic part 71 is completely located outside the adjustment through hole. The two ends of the elastic part 71 abut against the adjustment frame 60 and the splicing assembly 50 respectively to form a support for the splicing assembly 50.

Embodiment Four

Compared to Embodiment One, the structure of an adjustment unit 70 is different.

In this embodiment, the adjustment frame 60 has an adjustment through hole, and the adjustment through hole is used as a mounting port 61. The connection part 51 includes a connection pole, and the connection pole is adjustably connected with the adjustment unit 70 after passing through the adjustment through hole. In this embodiment, the connection pole is screwed into the adjustment unit 70, and the adjustment frame 60 and the adjustment unit 70 can rotate relative to each other. Meanwhile, the adjustment frame 60 and the adjustment unit 70 can synchronously move in the extension direction of the connection pole. When the adjustment unit 70 is rotated, the connection pole moves relative to the adjustment frame 60 and the adjustment unit 70 along the axial direction of the connection pole, so as to adjust the flatness of a splicing module 20.

Optionally, an adjustment unit 70 is a nut.

Apparently, the embodiments described above are merely partial but not all embodiments of the disclosure. Based on the embodiments in the disclosure, many other embodiments obtained by a person skilled in the art without making creative labor shall fall within the scope of protection of the present disclosure.

It should be noted that the terms used herein are merely intended to describe the specific embodiments, but not to limit the exemplary embodiments of the present disclosure. The singular terms, as used here, are also intended to include the plurals, unless the context explicitly states otherwise. It should be noted that when the terms "include" and/or "comprise" are used in this specification, it means the included characteristics, steps, works, devices, components, and/or a combination thereof.

It should be noted that the specification and claims of the present disclosure and the terms "first" and "second" in the accompanying drawings are used to distinguish similar objects, but not necessarily to describe a specific order. It should be understood that the numbers so used may be interchangeable, where appropriate, so that the embodiments of the present disclosure described herein can be implemented in a sequence other than those illustrated or described herein.

The above descriptions are merely some embodiments of the disclosure and are not intended to limit the disclosure, which may be changed and varied for those skilled in the art. Any modification, equivalent substitution, improvement made within the spirits and principles of the disclosure shall fall within the scope of protection of the disclosure.

What is claimed is:

1. A splicing structure, comprising: a support frame, including a frame base and an adjustment assembly movably disposed on the frame base, wherein the adjustment assembly includes a first adjustment structure and a second adjustment structure that move in different directions; and a plurality of splicing modules, a splicing module of the plurality of splicing modules configured to be detachably connected with a corresponding to-be-spliced structure, wherein the splicing module is movably disposed on one of the first adjustment structure and the second adjustment structure, while the other one of the first adjustment structure and the second adjustment structure has a driving state and a non-driving state, wherein: when the other one of the first adjustment structure and the second adjustment structure moves, touches, and pushes the splicing module, the other one of the first adjustment structure and the second adjusting structure is switched from the non-driving state to the driving state; and when the other one of the first adjustment structure and the second adjustment structure moves away from the splicing module, the other one of the first adjustment structure and the second adjustment structure keeps in the non-driving state; and at least two mounting brackets are disposed on a same splicing module; a first leveling structure is disposed on a first plate segment of a mounting bracket of the at least two mounting brackets; and a second leveling structure is disposed on a second plate segment of the mounting bracket of the at least two mounting brackets, wherein the first leveling structure and the second leveling structure are configured to adjust a flatness of the splicing module in different directions.

2. The splicing structure according to claim 1, wherein:
at least two of the plurality of splicing modules are movably disposed on the one of the first adjustment structure and the second adjustment structure; and/or
the other one of the first adjustment structure and the second adjustment structure is capable of synchronously touching or moving away from the at least two of the plurality of splicing modules, so that the at least two of the plurality of splicing modules is capable of moving synchronously along a same row and/or a same column.

3. The splicing structure according to claim 1, wherein:
a moving direction of the first adjustment structure is perpendicular to a moving direction of the second adjustment structure;
the first adjustment structure extends along a first direction, and an extension direction of the first adjustment structure is perpendicular to the moving direction of the first adjustment structure; and
the second adjustment structure extends along a second direction, the first direction is perpendicular to the second direction, and an extension direction of the second adjustment structure is perpendicular to the moving direction of the second adjustment structure.

4. The splicing structure according to claim 1, wherein:
two ends of the first adjustment structure are configured to align with two opposite sides of the frame base; and/or
the two ends of the first adjusting structure are slidably connected to the frame base; and/or
there are a plurality of first adjustment structures, and the plurality of first adjustment structures are disposed along a direction perpendicular to an extension direction of the plurality of first adjustment structures.

5. The splicing structure according to claim 1, further comprising a driving assembly, wherein the driving assembly is drivingly connected with the first adjusting structure and the second adjusting structure, respectively, so that the driving assembly independently drives the first adjustment structure and the second adjustment structure.

6. The splicing structure according to claim 1, wherein the mounting bracket is mounted onto the first adjustment structure, and the mounting bracket is slidably disposed along an extension direction of the first adjustment structure.

7. The splicing structure according to claim 6, wherein:
the mounting bracket includes a first plate segment and a second plate segment that are bent to form an angle, wherein the first plate segment and the second plate segment form a mounting region, and the first adjustment structure is placed in the mounting region.

8. The splicing structure according to claim 7, wherein:
the first plate segment and the second plate segment are disposed with adjustment holes;

the first leveling structure includes a first adjustment screw inserted into an adjustment hole of the first plate segment, and an end of the first adjustment screw abuts against a first location on a surface of the first adjustment structure; and the second leveling structure includes a second adjustment screw inserted into an adjustment hole of the second plate segment, and an end of the second adjustment screw abuts against a second location on the surface of the first adjustment structure.

9. The splicing structure according to claim 1, wherein the splicing module comprises:

a splicing assembly detachably disposed on the splicing assembly, wherein the splicing assembly has at least three non-collinear connection parts;

an adjustment frame disposed on a side of the splicing assembly facing the support frame, wherein the adjustment frame includes a mounting bracket for cooperating with the first adjustment structure and the second adjustment structure, and the adjustment frame includes a plurality of mounting ports corresponding to the connection parts; and a plurality of adjustment units, wherein the plurality of adjustment units are respectively disposed within the plurality of mounting ports, so as to adjust a flatness of the splicing assembly.

10. The splicing structure according to claim 9, wherein:
the adjustment frame includes a plurality of adjustment through holes, the adjustment through holes serve as the mounting ports, and a connection part includes a connection pole, wherein the connection pole is adjustably connected with an adjustment unit after passing through an adjustment through hole.

11. The splicing structure according to claim 10, wherein the adjustment unit comprises:

an elastic part, wherein the elastic part is sleeved on the connection pole and abuts against the splicing assembly and the adjustment frame; and a fastening nut, wherein a portion of the connection pole having passed through the adjustment through hole is connected with the fastening nut, so that the fastening nut is pressed against the adjustment frame.

12. The splicing structure according to claim 9, wherein the adjustment frame further includes a frame body, wherein the frame body includes the mounting ports, and the frame body includes at least three connection arms, the at least three connection arms are jointed at a first end, and the mounting ports and the mounting brackets are disposed on the connection arms at intervals.

13. The splicing structure according to claim 12, wherein:
the frame body is X-shaped; and/or
the plurality of mounting ports are provided in one-to-one correspondence with the plurality of connection arms, and the mounting ports are disposed at second ends of the connection arms; and/or
the mounting brackets are disposed between first ends and second ends of the connection arms.

14. The splicing structure according to claim 9, wherein the splicing assembly comprises:

a leveling frame, wherein the leveling frame includes a central opening area and a plurality of connection parts, wherein the plurality of connection parts are disposed at intervals along a circumferential edge of the central opening area; and a support board, wherein the support board is disposed on a side of the leveling frame away from the adjustment frame, and the to-be-spliced structure is connected to a surface of the leveling frame on a side away from the support board.

15. The splicing structure according to claim 14, wherein one of the leveling frame and the support board includes a slider, and the other one of the leveling frame and the supporting plate includes a slide, and the slide is slidably placed inside the slider.

16. The splicing structure according to claim 14, wherein the splicing module further includes a third adjustment screw, and on a side facing to the leveling frame, the support board includes at least two adjustment lugs disposed at intervals, wherein an adjustment lug includes a third adjustment hole, the adjustment frame is located between the two adjustment lugs, and the third adjusting screw passes through the third adjustment hole and abuts against the adjustment frame.

17. The splicing structure according to claim 1, wherein at least one of a first anti-collision connector and a second anti-collision connector are disposed on a side wall of the splicing module, and a first anti-collision connector on one splicing module is connected to a second anti-collision connector on an adjacent splicing module through a snap fit connection.

18. The splicing structure according to claim 1, wherein the first adjustment structure includes at least two position-limit bumps on a side away from the splicing module, and the two position-limit bumps are located on an inner side of the frame base and cooperate with a side of the frame base to form position limits, to limit a range of movement of the splicing module.

19. A display screen, comprising: a splicing structure, the splicing structure including: a support frame, including a frame base and an adjustment assembly movably disposed on the frame base, wherein the adjustment assembly includes a first adjustment structure and a second adjustment structure that move in different directions; and a plurality of splicing modules, a splicing module of the plurality of splicing modules configured to be detachably connected with a corresponding to-be-spliced structure, wherein the splicing module is movably disposed on one of the first adjustment structure and the second adjustment structure, while the other one of the first adjustment structure and the second adjustment structure has a driving state and a non-driving state, wherein: when the other one of the first adjustment structure and the second adjustment structure moves, touches, and pushes the splicing module, the other one of the first adjustment structure and the second adjusting structure is switched from the non-driving state to the driving state; and when the other one of the first adjustment structure and the second adjustment structure moves away from the splicing module, the other one of the first adjustment structure and the second adjustment structure keeps in the non-driving state; and a plurality of sub-screens, wherein the plurality of sub-screens are correspondingly connected to the plurality of splicing modules of the splicing structure; and the splicing module comprises: a splicing assembly detachably disposed on the splicing assembly, wherein the splicing assembly has at least three non-collinear connection parts; an adjustment frame disposed on a side of the splicing assembly facing the support frame, wherein the adjustment frame includes a mounting bracket for cooperating with the first adjustment structure and the second adjustment structure, and the adjustment frame includes a plurality of mounting ports corresponding to the connection parts; and a plurality of adjustment units, wherein the plurality of adjustment units are respectively disposed within the plurality of mounting ports, so as to adjust a flatness of the splicing assembly.

\* \* \* \* \*